| United States Patent [19] | [11] Patent Number: 4,473,906 |
| Warnaka et al. | [45] Date of Patent: Sep. 25, 1984 |

[54] ACTIVE ACOUSTIC ATTENUATOR

[75] Inventors: Glenn E. Warnaka, Erie; Lynn A. Poole; Jiri Tichy, both of State College, all of Pa.

[73] Assignee: Lord Corporation, Erie, Pa.

[21] Appl. No.: 213,254

[22] Filed: Dec. 5, 1980

[51] Int. Cl.$^3$ .................... H04B 15/00; H04B 11/00; F01N 1/06
[52] U.S. Cl. ........................................ 381/71; 381/73
[58] Field of Search ...................... 179/1 F, 1 P, 1 D; 181/206; 381/71, 94, 96, 98, 103, 108, 121

[56] References Cited

U.S. PATENT DOCUMENTS

| | | | |
|---|---|---|---|
| 2,043,416 | 6/1936 | Lueg | 381/71 |
| 2,618,353 | 11/1952 | Hendrick | 181/250 |
| 2,776,020 | 1/1957 | Conover et al. | 381/71 |
| 2,983,790 | 5/1961 | Olson | 381/71 |
| 3,247,925 | 4/1966 | Warnaka | 179/114 R |
| 3,396,812 | 8/1968 | Wilcox et al. | 181/250 |
| 3,685,610 | 8/1972 | Bschorr | 181/206 |
| 3,784,747 | 1/1974 | Berkley et al. | 179/81 B |
| 3,826,870 | 7/1974 | Wurm et al. | 179/1 P |
| 3,922,488 | 11/1975 | Gabr | 381/94 |
| 3,936,606 | 2/1976 | Wanke | 179/1 P |
| 4,025,724 | 5/1977 | Davidson, Jr. et al. | 381/71 |
| 4,044,203 | 8/1977 | Swinbanks | 381/71 |
| 4,109,108 | 8/1978 | Coxon et al. | 179/1 P |
| 4,122,303 | 10/1978 | Chaplin et al. | 179/1 P |
| 4,153,815 | 5/1979 | Chaplin et al. | 179/1 P |
| 4,171,465 | 10/1979 | Swinbanks | 179/1 P |
| 4,177,874 | 12/1979 | Angelini et al. | 181/206 |
| 4,238,746 | 12/1980 | McCool et al. | 333/166 |

FOREIGN PATENT DOCUMENTS

| | | | |
|---|---|---|---|
| 2507428 | 8/1975 | Fed. Rep. of Germany | 181/206 |
| 1357330 | 6/1974 | United Kingdom | 181/206 |
| 1512014 | 5/1978 | United Kingdom . | |

OTHER PUBLICATIONS

Mohammed Ulysses Fips, I.R.E., Noise Neutralizer, Apr. 1952, pp. 52-53.
Radio Electronics, Sound Destroys Sound, Aug. 1954, pp. 70-71.
W. B. Conover, Fighting Noise with Noise, Mar. 1956, pp. 78-82, 92.
H. F. Olson, Electronic Control of Noise, Vibration, & Reverberation, Sep. 1956, pp. 966-972.
DiStefano, et al., Linear Systems & Differential Equations, 1967, pp. 31-32 and The Laplace Transform pp. 56-59, pp. 355-356.
J. C. Bleazy, Electronic Sound Absorber, Apr. 1962, vol. 10, No. 2, pp. 135-139.
S. Onoda et al., Automatic Control of Stationary Noise by Means of Directivity Synthesis, Aug. 21-28, 1968, pp. F-185-F-188.
B. Widrow, Adaptive Filters, 1971, pp. 1-25.
J. J. M. Jessel et al., Active Sound Absorbers In An Air Duct, 1972, pp. 384-390.
M. A. Swinbanks, The Active Control of Sound Propagation in Long Ducts, 1973, pp. 412-436.
B. Widrow et al., Adaptive Noise Cancelling: Principles and Applications, Dec. 1974. vol. 63, No. 12.

(List continued on next page.)

*Primary Examiner*—A. D. Pellinen
*Assistant Examiner*—Randall P. Myers
*Attorney, Agent, or Firm*—Wood, Herron & Evans

[57] ABSTRACT

An active attenuator is provided for the attenuation of a relatively broad band of lower frequency vibration such as sound waves from a given source, by the introduction of cancelling vibration having the mirror image amplitude and phase characteristics of the source vibration. The active attenuator herein includes an input sensor for detecting the source vibration, a cancelling speaker for generating cancelling vibration, an error sensor for sensing the combination of source and cancelling vibration, and an electronic controller coupled to the input sensor, cancelling speaker and error sensor. The electronic controller includes an adaptive cancelling filter which employs a deterministic algorithm operable to accommodate the propagation delays of the vibration sensed by the input and error sensors, and produce an output to activate and control the cancelling speaker for the production of cancelling vibration.

21 Claims, 18 Drawing Figures

OTHER PUBLICATIONS

J. H. B. Poole et al., An Experimental Study of Swinbanks' Methods of Active Attenuation of Sound in Ducts, 1976, pp. 257-266.

H.G. Leventhall, Developments in Active Attenuators, Oct. 1976, pp. 1-10.

J. M. McCool, Principles and Applications of Adaptive Filters: A Tutorial Review, Mar. 1977, i-31.

Apparent Disclosure Document of Chaplin et al., dated Oct. 26, 1977.

M. G. Larimore, Adaptive Noise Cancelling Via Input Equalization, 1978 pp. 304-309.

N. Hesselmann, Investigation of Noise Reduction on a 100 kVA Transformer Tank by Means of Active Methods, 1978, pp. 27-34.

G. Canevet, Active Sound Absorption in an Air Conditioning Duct, 1978, pp. 333-345.

Journal of Sound, Active Attenuation of Noise in Ducts, 1978 pp. 308-309.

G. B. B. Chaplin et al., The Sound of Silence, Jul. 1978.

Electronics, Microprocessor–Based Sound Deadener Cuts Low–Frequency Noise Up to 20 dB in Tests, Jul. 6, 1978, pp. 70-71.

New Scientist, Scientists Make a Sucker of a Loud Speaker and Make Your Own Microfiche—On a Video Disc., Sep. 28, 1978 p. 939.

M. R. Sambur, Adaptive Noise Canceling for Speech Signals, Oct. 1978, vol. ASSP-26, No. 5, pp. 419-423.

NRDC News, NRDC and Lord Corporation Announce Disclosure Agreement on Active Silencers, Nov. 20, 1978, pp. 1-2.

J. E. Paul, Adaptive Digital Techniques for Audio Noise Cancellation, 1979 vol. 1, No. 4., pp. 2-7.

A. R. Davidson, Jr. Active Reduction of Low Frequency Sound From Large Vibrating Surfaces, Aug. 15, 1975, pp. i-9 and Chapter V pp. 134-167.

R. E. Kalman, On the General Theory of Control Systems, pp. 481-492.

J. C. Burgess, Active Adaptive Sound Control in a Duct: A computer Simulation, 1981, pp. 715-726.

R. D. Marciniak, A Nearfield, Underwater Measurement System, 1979, pp. 955-964.

The 100th Meeting of the Acoustical Society of America, Nov. 21, 1980, pp. S91-S92.

Warnaka, Active Attenuation of Noise-The State of the Art, May-Jun. 1982, pp. 100-110.

PRIOR ART

ACTIVE ACOUSTIC ATTENUATOR

FIELD OF THE INVENTION

The subject invention relates to the field of acoustic attenuation, and, more particularly, to a device capable of attenuating a narrow or broad band of lower frequency sound and single frequencies propagating from a given source through a confined area such as a duct by the introduction of cancelling sound which is 180° out of phase and equal in amplitude to the source sound.

BACKGROUND OF THE INVENTION

Significant reductions in the sound pressure levels of sound carried through confined enclosures such as ducts has been an unresolved problem for many years. In factories, for example, the noise produced by machinery and various manufacturing operations may be carried from the heating and ventilating ducts in such areas to the ducts which connect to offices and other parts of the plants in which a low level of noise is desired. This is particularly a problem with low frequency noise in the range of infrasound to 800 Hertz, since passive means to attenuate such frequencies are costly, relatively inefficient and physically large in size making them impractical for use in most low frequency applications.

Beginning in 1925 and continuing at an extremely rapid pace today, developments in electronics have made the concept of "active" attenuation of noise to be not only a possible but attractive alternative to passive attenuation of low frequencies. The principle of so-called active attenuation is based on the fact that the speed of sound in air is much less than the speed of electrical signals. In the time it takes for a sound wave to propagate from a location where it is detected to a remote location where it may be attenuated, there is sufficient time to sample the propagating wave, process such information within an electronic circuit and produce a signal to drive a speaker which introduces cancelling sound 180° out of phase and equal in amplitude to the propagating sound. Although the process of active attenuation of sound stated above appears to be conceptually simple, a review of the prior art in this area will illustrate the complexity of the problem and the difficulty of obtaining good attenuation over a relatively broad band of lower frequencies.

One of the first efforts in the area of active attenuators is disclosed in U.S. Pat. No. 2,043,416 to Lueg shown in FIG. 1. The Lueg system is a monopole consisting of a microphone, amplifier and speaker. The microphone detects the source sound and converts its into an electrical signal which is fed to the amplifier. The loudspeaker, driven by the amplifier, is disposed downstream from the microphone at a location to give the necessary time delay to accomplish a 180° phase reversal from the source sound. The loudspeaker injects a mirror image of the source sound into the duct so that as the source sound passes the location of the loudspeaker, a volume of either high or low pressure air is introduced 180° out of phase with the corresponding high and low pressure volume of air of the source sound. When the loudspeaker is perfectly synchronized with the passage of the source noise, the pressure of the source noise and that of the loudspeaker averages to 0 (ambient static pressure) and the noise is "cancelled".

It is apparent from an examination of the Lueg system that attenuation will occur if the distance between the microphone (where the source sound is sampled) and the loudspeaker (where the cancelling sound is introduced) is such that the phase shift of the electrical signal sent to the amplifier equals 180° or an odd multiple of 180°. However, this condition will occur only for a specific stationary acoustic signal which does not vary in time. As a practical matter therefore, the Lueg system is effective only for a single frequency since no means are provided to accommodate phase change. What this limitation of the Lueg system shows is that there are two parameters which must be met for good attenuation, including delay time, to allow the acoustic wave to move from the point of detection to the point of attenuation, and phase, to assure that attenuation occurs at the point of introduction of the cancelling acoustic wave.

In addition to the limitation of the Lueg system associated with phase detection and accomodation, a problem exists with the generation of standing waves by the loudspeaker in the upstream direction toward the microphone. Because of the standing wave pattern, the pressure of the sound field at the microphone is artificially nonuniform which means that at a given frequency the microphone may be located at a node or antinode of a standing wave. Therefore the cancellation signal produced by the speaker may be made to be too great or too little. As a result, the sound field may be amplified by the standing waves in such a way that the resulting propagation downstream from the speaker could be even greater than the sound produced by the source. In addition, the standing wave field could intensify the sound pressure in the duct and more sound could pass through the walls of the duct creating a secondary problem.

In an effort to avoid the above-identified standing wave problem and expand the frequency range of attenuation, several active attenuation systems have been developed subsequent to the Lueg system. One prior art system, shown in FIG. 2, utilizes the combination of a monopole/dipole arrangement with the dipole being located on one wall of the duct and the monopole being located on the opposite side of the duct as shown. This system was first introduced by M. Jessel and G. Mangiante and is described in a paper entitled, "Active Sound Absorbers In An Air Duct", *JSV* (1972) 23 (3,383-390). The dipole and monopole of the Jessel system are phased so that they add in the downstream direction and subtract in the upstream direction allowing a unidirectional propagation to be formed when the sources are balanced. It has been found however that the results obtainable with the Jessel system are frequency dependent and related to the half wave length of the dipole separation. In addition, the complexity of this system does not lend itself for use in many practical applications.

As a means of simplification of the Jessel system and to obtain improved performance, the dipole systems shown in FIGS. 3 and 4 were developed. The system shown in FIG. 3 is discussed in U.S. Pat. No. 4,044,203 to Swinbanks. Swinbanks removed the monopole found in Jessel and altered the phase characteristics of the dipole so that the propagation of both sources is added in the downstream direction and cancelled in a direction upstream toward the microphone. The active attenuator shown in FIG. 4, and disclosed in U.S. Pat. No. 4,109,108 to Coxon et al, locates the microphone between two loudspeakers to produce a minimum level at the microphone position when the proper phasing between the speakers is introduced. While this system is reflective and produces a standing wave pattern upstream of the dipole, the detection system (microphone) is not affected because it is located between the speakers, unlike the Swinbanks system.

In reviewing the performance of the dipole and dipole/monopole systems, it has been found that each of these multisource systems seem to have geometry related limitations. The physical spacing of the loudspeakers and microphones produces a "tuning effect" which sets the frequency of best performance and the bandwidth. Although high levels of attenuation are possible, particularly with the Swinbanks systems, such a performance is obtainable only through a relatively small band width on the order of about 2½ octaves maximum. Accordingly, the most recent approaches to active noise attenuation in ducts have concentrated on improvement of the monopole system first introduced by Lueg as discussed above. U.S. Pat. No. 4,122,303 to Chaplin et al is one example of a monopole system in which relatively sophisticated electronic circuitry is incorporated into the basic microphone/loudspeaker construction found in the Lueg system. In Chaplin et al, a secondary cancelling wave is produced by a first electrical signal which represents the primary sound wave sensed by a microphone. The first electrical signal is convolved with the second signal derived from the system impulse response as a program of operational steps. This process represents the standard operation of an adaptive filter as described in "Feedback and Control Systems", *Schaum's Outline Series*, 1967, pp. 179–185; "Adaptive Filters", Widrow, B., *Aspects of Network and System Theory*, (1971); "Principles and Applications of Adaptive Filters: A Tutorial Review", McCool, J. M.; Widrow, B., *Institute of Electrical Engineers*, (1976). To avoid the problem of standing waves produced by the loudspeaker and propagated upstream to the microphone, Chaplin et al suggests the use of a unidirectional microphone or lining the duct between the speaker and microphone with acoustically absorbant material. In addition, Chaplin et al suggests the possibility of incorporating circuitry to provide a second convolution capable of compensating for the feedback signal produced by the upstream standing waves. However, as discussed in more detail below, the so-called adaptation process of the Chaplin et al system occurs over a period of from 5 to 30 minutes and is thus dependent on the source signal remaining essentially constant over that period. Moreover, the control system functions so slowly that in most practical cases it must be manually shut off while the first convolution process is still operative to avoid "system hunting" or oscillation between better and poorer results.

It should also be noted that each of the systems identified above share a common problem which in many practical applications will reduce if not eliminate their potential use. In each case, the speaker portion of the system is placed directly in the environment of the duct to introduce the cancelling sound. It is anticipated that in many applications existing speakers will not be able to survive the temperatures, particulates or other foreign materials found in the environment of the duct or in unprotected areas outside of the duct.

SUMMARY OF THE INVENTION

The subject invention is a modified monopole-type active acoustic attenuator which may be thought of as consisting of three separate components including a physical system, electronic circuitry and a coupling component between the physical system and circuitry. The physical system consists of the duct through which sound waves propagate from a given source, an acoustic mixer connected in line with the duct, a speaker disposed in a protective enclosure at a spaced distance from the duct and a waveguide connecting the speaker to the acoustic mixer. The electronic circuitry component of the active attenuator herein consists of three distinct adaptive filters utilizing a modification of the Widrow-Hoff LMS or least mean square algorithm in a true adaptive acoustic cancelling configuration. A microphone array, disposed in the duct at a location upstream from the acoustic mixer, and a microphone positioned within the acoustic mixer downstream from the waveguide form the coupling means between the physical system and electronic circuitry.

As discussed in detail below, the operation of the subject invention may be described in general terms as follows. The microphone array senses the source sound in the duct and converts it to an electrical signal which is sent to a modified adaptive filter in the electronic circuitry component herein. The adaptive filter generates a signal to drive the speaker for the production of "cancelling" sound 180° out of phase with the source sound, which propagates through the waveguide to the acoustic mixer where it is combined with the source sound. The microphone located in a position downstream from the waveguide within the acoustic mixer, detects the sound resulting from the combination of the source and cancelling sound and produces a signal which represents the "error" or difference between the attenuation achieved in the acoustic mixer and the desired attenuation based on preset levels. This error signal is introduced into the adaptive filter which then adjusts its signal driving the speaker so that the "cancelling" sound propagating into the acoustic mixer more nearly approximates the mirror image of the source sound. High levels of attenuation are thus achieved within the acoustic mixer and everywhere in the far field.

Several improvements and departures from prior art active attenuator systems have been made in the subject invention both in the physical system and electronic circuitry components described above. These will become apparent in the following discussion of the preferred embodiment. Such improvements have resulted in a performance capability of the active attenuator herein which far exceeds that of any known systems both in terms of the attenuation achieved and the speed and flexibility of operation.

Therefore it is an object of the subject invention to provide an active acoustic attenuator consisting of a physical component, an electrical circuitry component and coupling means between the two.

It is another object of the subject invention to provide an active acoustic attenuator having a physical system component characterized by a speaker disposed in a protective enclosure at a location remote from the duct, which is connected thereto by a waveguide.

It is a further object herein to provide an active acoustic attenuator having a physical system component consisting of an acoustic mixer into which a waveguide is connected at a discrete distance from the termination thereof.

It is still another object of the present invention to provide an active acoustic attenuator in which there is a specific geometrical relationship between the relative location of the microphone array, speaker, waveguide and error microphone which is necessary to achieve desired attenuation.

It is a still further object to provide an active acoustic attenuator having an electronic circuitry component characterized by adaptive filters utilizing a modified Widrow-Roff LMS algorithm.

It is another object of the subject invention to provide an active acoustic attenuator having an electronic circuitry component which operates in a deterministic fashion, in contrast to prior art trial and error circuitry functions.

It is a further object of the subject invention to provide an active acoustic attenuator having an electronic circuitry component consisting of three distinct adaptive filters each providing a separate function.

DESCRIPTION OF THE DRAWINGS

Objects in addition to the foregoing will become apparent upon consideration of the following description taken in conjunction with the accompanying drawings wherein:

FIG. 7b is a partial cross sectional view taken generally along line 7b—7b of FIG. 7a.

DETAILED DESCRIPTION OF THE INVENTION

Initially, it should be noted that the approach taken in the subject invention to achieve active attenuation of noise is believed to be a significant departure from the approach followed in the development of prior art systems. All previous known designs of systems for the active attenuation of sound within a duct have proceeded initially with an attempt to solve the problem in its entirety. This approach invariably involves a symbolic mathematical treatment of the subject which tends to result in theoretical generalities at the expense of obtaining specific design details.

The subject invention was conceived and designed with the recognition that active systems for the attenuation of noise in ducts involve three discrete component parts including the physical system, the electronic system (controller) and the coupling system between the two. This approach recognizes the parallel nature of the system and the fact that system performance cannot exceed the performance of any component part. By independently developing and testing each component part of the system herein, it has been found that results were obtained much more quickly than in past experience. This is primarily due to the fact that any problems encountered in system operation were much more easily identified as being caused by a specific component of the system, thus eliminating guess work and unneeded modification. Although such a procedure seems to be conceptually apparent, it is believed that progress in the area of active sound attenuation has been needlessly delayed to at least some extent simply by the unduely complex approach to the problem utilized by prior art inventors.

PHYSICAL SYSTEM COMPONENT

Figure 1:
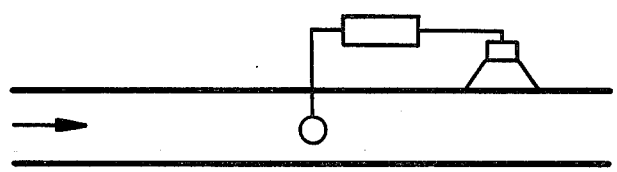
FIG. 1 is the prior art Lueg monopole acoustic attenuator system.
Figure 2:
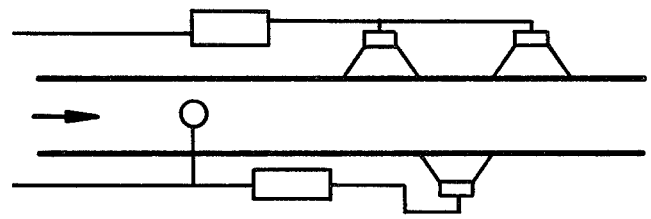
FIG. 2 is the prior art Jessel et al tripole or monopole/dipole acoustic attenuator system.
Figure 3:
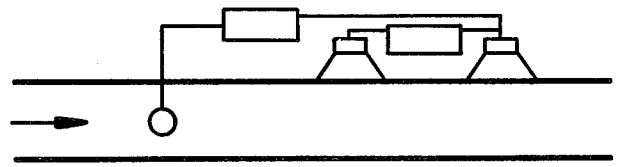
FIG. 3 is the prior art Swinbanks et al dipole acoustic attenuator system.
Figure 4:
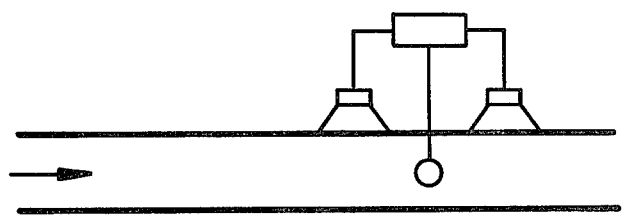
FIG. 4 is the prior art Coxon et al dipole acoustic attenuator system.
Figure 5:
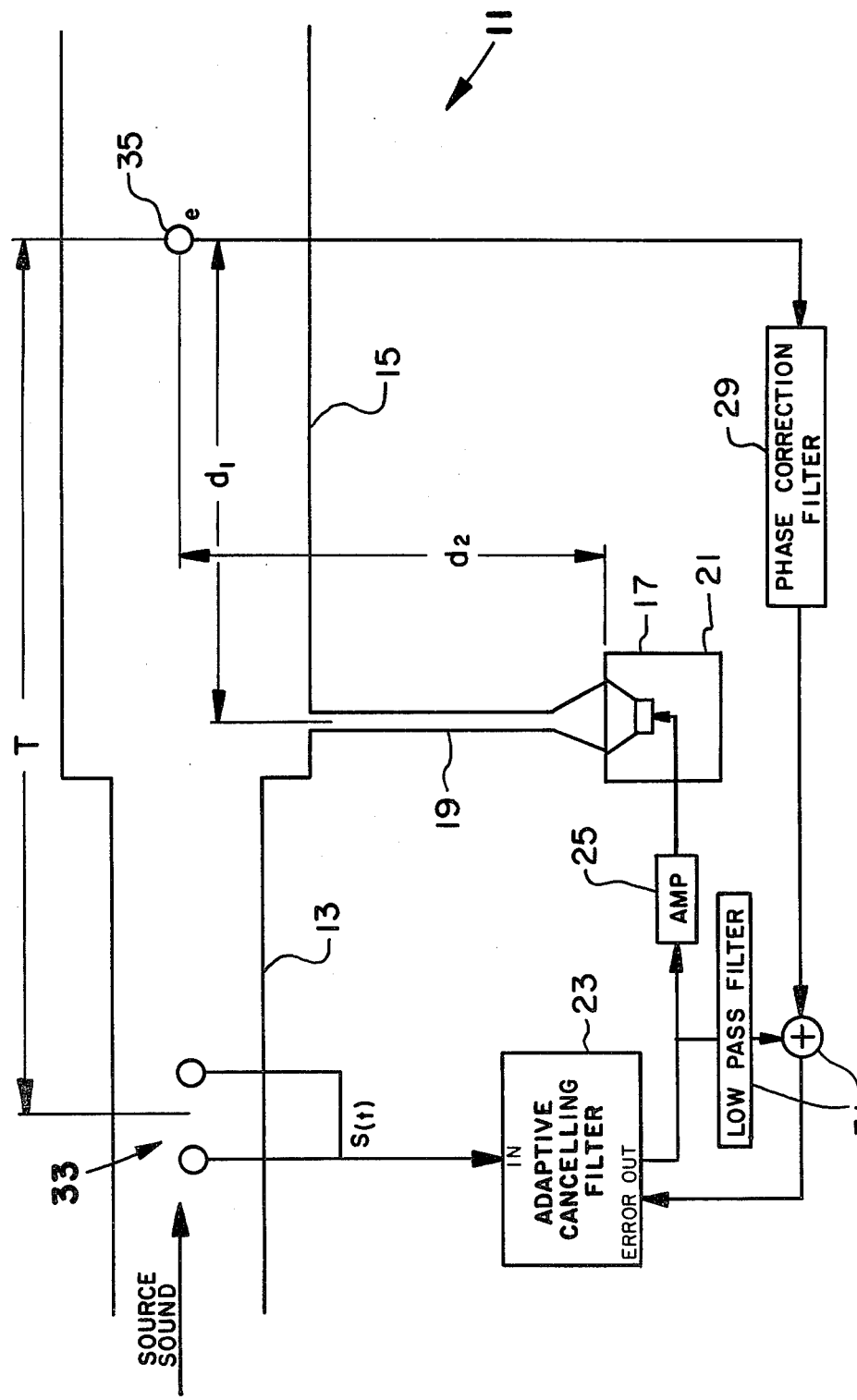
FIG. 5 is a view of a simplified version of the active acoustic attenuator of the subject invention.

Referring now to the drawings and in particular to FIG. 5, the active acoustic attenuator of the subject invention is labelled generally with the reference 11. As discussed above, the active attenuator 11 may be thought of as consisting of three distinct components and the discussion in this section will be directed primarily to the physical system component with general references to the other components where necessary. The physical system includes a duct 13 through which sound from a given source propagates, an acoustic mixer 15 connected to duct 13, a speaker 17 which is the source of cancelling sound and a wave guide 19 which connects the speaker 17 with the acoustic mixer 15.

Although the acoustic mixer 15 is shown as having a slightly larger diameter than duct 13, this geometric relationship is not required for proper performance of active attenuator 13 and is shown herein for purposes of discussion and illustration only.

One of the immediately apparent advantages of the active attenuator 11 over prior art systems is that the speaker 17 is disposed at a remote location from the duct 13, and is connected to acoustic mixer 15 by an elongated waveguide 19 which may be provided with valve means (not shown) to prevent dust particles, caustic material or other debris flowing through duct 13 from damaging speaker 17. As shown in FIGS. 1-4, each of the prior art active attenuators dispose the speaker directly in the duct where the internal and external conditions which could be encountered in many applications would quickly damage or ruin them. The speaker 17 is not only protected from the internal environment of the duct 13 and acoustic mixer 15 by waveguide 19, but it is contained in an enclosure 21 which protects speaker 17 from the external environment of the duct 13. Enclosure 21 must have a high transmission loss and may also be lined with acoustically absorbant material to further prevent the output of speaker 17 from propagating in a direction other than through waveguide 19. It should be understood that waveguide 19 is completely separate from duct 13 and acoustic mixer 15; that is, waveguide 19 is not a branch duct and thus no flow from the main duct 13 is carried through the waveguide 19. Waveguide 19 is provided solely for the purposes of carrying the cancelling noise from speaker 17 to acoustic mixer 15 and for isolating and protecting speaker 17 from the environment of duct 13.

The electronic component of the active attenuator 11 is shown in its simplest form in FIG. 5 for purposes of the present discussion. A detailed description of the electronics of the subject invention will be provided below including an explanation of the complete circuitry utilized herein. The simplified version of the electronic component of active attenuator 11 includes an adaptive filter 23, an amplifier 25, a phase correction filter 29 and a DC loop labelled generally with the reference 31. The coupling component of the subject invention, which couples the physical system with the electronic system, consists of a microphone array 33 disposed in duct 13 in advance or upstream of waveguide 19 for sensing the source sound, and a microphone 35 disposed in acoustic mixer 15 downstream from waveguide 19 for purposes to become apparent below.

Generally, in the cancelling mode of operation, active attenuator 11 operates as follows. Broad band noise propagates down duct 13 and is sensed by microphone array 33 which produces a signal sent to adaptive filter 23. Adaptive filter 23 provides an output to drive speaker 17 which introduces "cancelling" noise through waveguide 19 into acoustic mixer 15. Since a sound wave consists of a sequence of compressions and rarefactions at a given phase and frequency, the pressure of such waves can be reduced or "cancelled" by generating a secondary wave having compressions and rarefactions equal in amplitude and 180° out of phase with the primary sound waves. The microphone 35 located downstream from waveguide 19 in acoustic mixer 15 senses the degree of attenuation or cancellation of the source sound after the sound waves produced by speaker 17 have been combined with it. The signal from microphone 35 is sent to adaptive filter 23 as an error signal, which, in effect, is an indication of the attenuation achieved within acoustic mixer 15. The adaptive filter operates to adjust its output depending on the character of the error signal, so that the speaker 17 is driven to produce "cancelling" sound which is more nearly equal in amplitude and 180° out of phase with the source sound.

Figure 6:
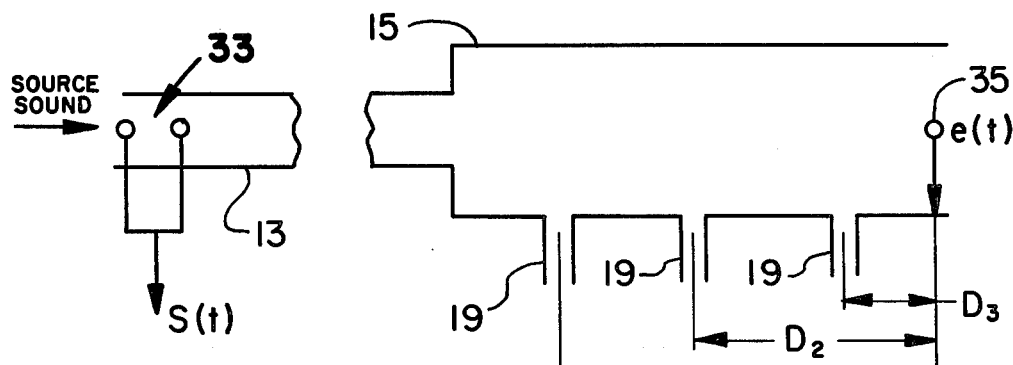
FIG. 6 is a partial view of the subject invention showing various points of introduction of the waveguide into the acoustic mixer.

Referring now to FIG. 6, a geometrical requirement for optimum operation of active attenuator 11 is illustrated. In FIG. 6, the waveguide 19 is shown entering acoustic mixer 15 at locations $D_1$, $D_2$ and $D_3$ respectively from the end of what will be considered the entire duct system. In accordance with the relationship shown below equation (1), it has been found that the waveguide 19 must be positioned at a specific distance from the end of acoustic mixer 15 to obtain proper attenuation of the source signal before it leaves the duct system. This relationship is $$D > 3l \qquad (1)$$

Where:
D = distance of waveguide 19 from the end of the duct system.
l = the largest dimension (height or width) of the acoustic mixer 15 or the diameter of a round duct. The relationship shown in Equation (1) expresses a threshold condition for the physical placement of waveguide 19 from the end of the duct system wherein optimum attenuation results. Equation (1) may be expressed in terms of attenuation as follows:

$$A_{dB} = \beta \tan h (\alpha l) \qquad (2)$$

Where:
$A_{dB}$ = attenuation in decibels
$\beta$ = a limiting maximum attenuation for a given geometrical relationship
l = characteristic duct dimension e.g. the diameter of a circular duct length of a side of a square duct longest side of a rectangular duct
$\alpha$ = Any number zero or greater Equation (2) reveals that the attenuation obtained with the active attenutator 11 varies according to the hyperbolic tangent of $\alpha l$ as the location of waveguide 19 is moved relative to the end of the duct system which has been shown in FIG. 6 as the termination of acoustic mixer 15. As mentioned above, the system performance of active attenuator 11 can be no better than the limitation of any of its components. The geometrical limitation of the physical system component discussed above must be observed to optimize the overall attenuation which can be achieved.

It should be noted that while FIGS. 5 and 6 show the waveguide 19 as entering acoustic mixer 15 at a right angle, this is not a requirement of the subject invention. Extensive experimentation has been conducted in which waveguide 19 is disposed at various angles relative to acoustic mixer 15 including angles of 0°, 30°, 45° and 60°. In each instance, the level of attenuation observed was essentially equal to that for the case in which waveguide 19 is perpendicular to acoustic mixer 15. This feature of the subject invention is particularly advantageous from the standpoint of installation, since it is anticipated that many applications may have space limitations which would require that the waveguide 19 be introduced into a duct at an angle other than 90°.

Figure 8:
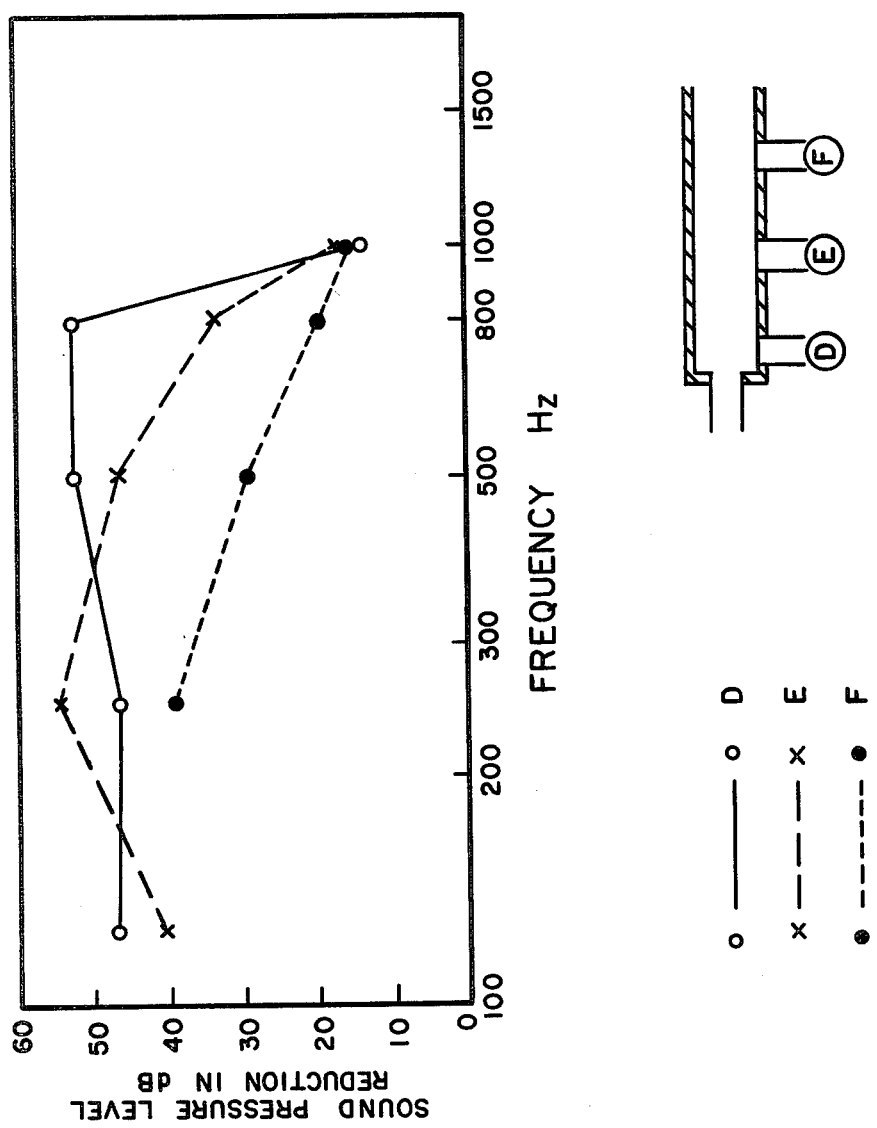
FIG. 8 is a graph of the attenuation achieved herein with the configuration of the subject invention shown in FIG. 6.

One of the primary attractions of active noise attenuators is their usefulness in attenuating sound of relatively low frequencies. Referring to FIG. 8, a graph of the attenuation possible in the physical system of the subject invention having the configuration shown in FIGS. 5 and 6 is illustrated. The results obtained show the decay in attenuation as waveguide 19 is moved toward the end of the duct system, in accordance with Equations (1) and (2). The attenuation levels were observed in a laboratory environment in a duct having dimensions of 5 inches by 7 inches, without using the electrical circuitry component of the subject invention. As such, the data points reflect the maximum attenuation levels which can be obtained with the physical system described above. Actual attenuation levels using the electrical components herein have been found to be in the range of between 25 and 35 db for 5 inch by 7 inch ducts and for ducts having a wide range of dimensions. This reduction in the level of attenuation is due to normal component tolerances, approximations and errors in the electronic system and because the signal to noise ratio of state-of-the-art electrical components is of the order of 60 db, all of which act to limit the overall system performance.

Figure 7:
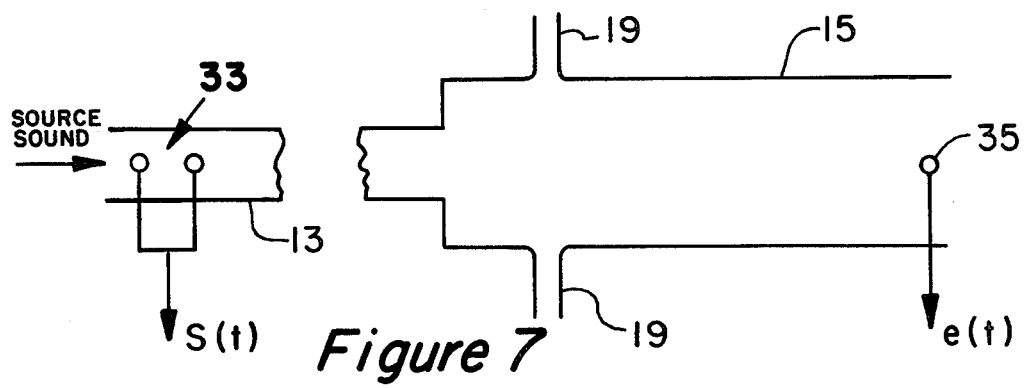
FIG. 7 is an alternate embodiment of the subject invention in which two waveguides are symmetrically introduced into the acoustic mixer.
Figure 7A:
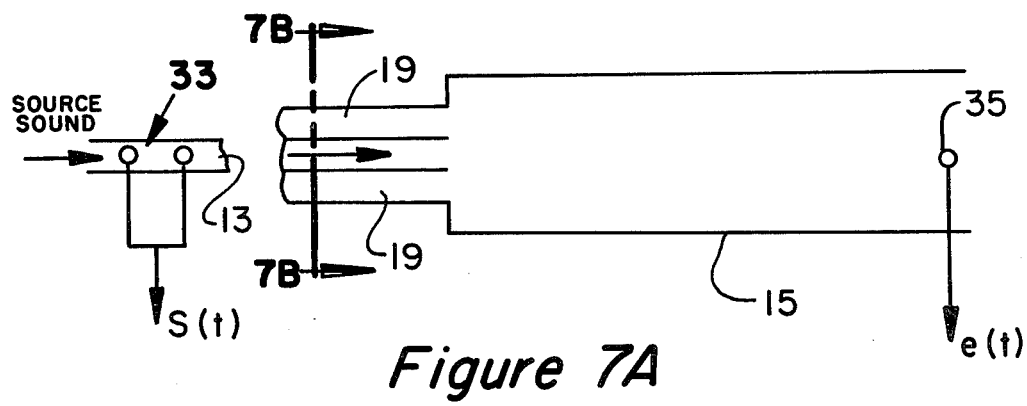
FIG. 7a is a variation of the symmetrical introduction of the waveguide(s) into the acoustic mixer.
Figure 9:
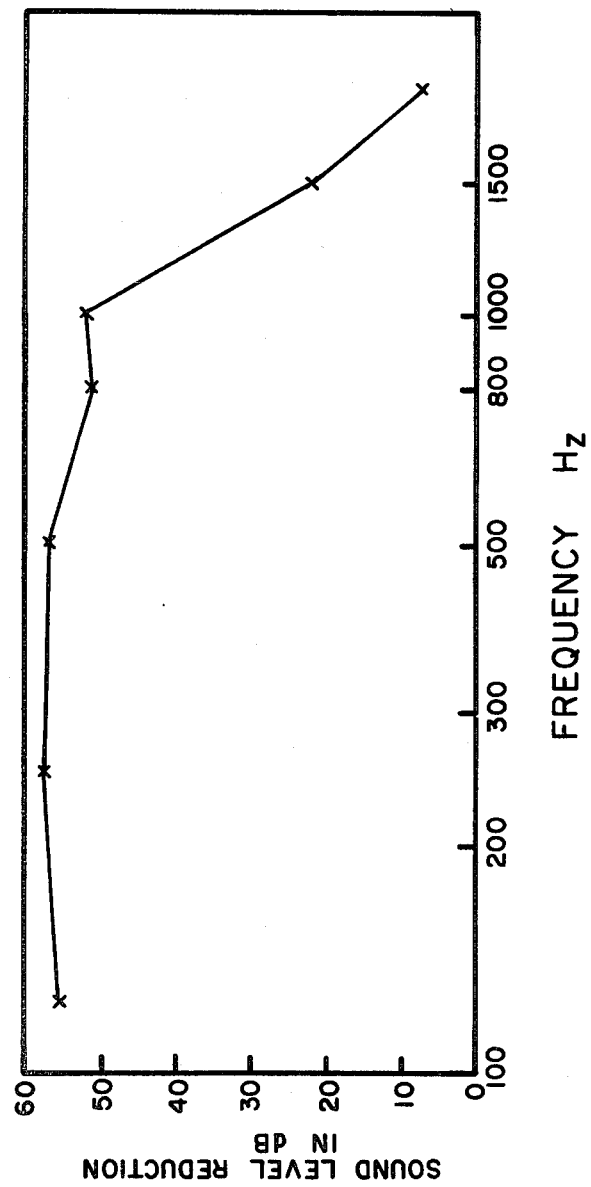
FIG. 9 is a graph of the attenuation achieved herein with the configuration of the subject invention shown in FIG. 7b.

As can be observed in FIG. 8, the embodiment of the subject invention shown in FIGS. 5 and 6 is capable of providing relatively high attenuation to a frequency level where the first cross mode is encountered. For a 5 inch by 7 inch duct, the first cross mode occurs at approximately 980 Hz. Although higher frequencies could be attenuated using passive means, the size, expense and inefficiency of passive attenuators limits their use in many applications. It was unexpectedly discovered, however, that the range of attenuation possible with active noise attenuator 11 could be expanded to frequencies up to the second cross mode by introducing the cancelling sound through waveguides 19 disposed in the symmetric configurations shown in FIGS. 7 and 7a. FIG. 9 shows a graph for a configuration of active attenuators 11 essentially the same as that shown in FIG. 7a in which a pair of waveguides 19 are introduced parallel to and on either side of duct 13, which confirms the elimination of the first cross mode.

Figure 7B:
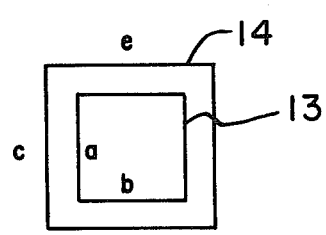

The following description will provide a short discussion of the theoretical reasons for the elimination of the first cross mode where cancelling sound is symmetrically introduced into a duct carrying the source sound. Referring to FIG. 7b, which is an end view of the embodiment of the subject invention shown in FIG. 7a, the dimensions of the primary duct 13 are given as a and b through which the source sound is propagated, and the dimensions of the symmetrically disposed secondary duct 14 (corresponding to waveguide 19) are given as c and e through which the cancelling sound is propagated. Assumin that the source sound and cancelling sound propagate in the z direction, the sound pressure at any point (x, y, z≦0) in the duct may be expressed as follows:

$$P(x,y,z,t) = \sum_{m,n=0}^{\infty} (A_{mn}) \left( \cos \frac{m\pi}{a} x \times \cos \frac{n\pi}{b} y \right) (e^{-jk_z z})(e^{j\omega t}) \quad (3)$$

Where:
$A_{mn}$: describes a coefficient dependent on the source $\cos \frac{m\pi}{a} x \times \cos \frac{n\pi}{b} y$:

Describes the propagation of waves in the x and y direction for a duct with hard walls
$e^{-jk_z z}$: describes the propagation of waves in the z direction
$e^{j\omega t}$: describes a time term.

From Equation (3) conventional methods of solution may be used to show that the sound pressure below the first cross mode may be expressed as:

$$P_{oo} = \frac{\rho c}{ab} (U_1 S_1 + U_2 S_2) e^{-jk_z z} e^{j\omega t} \quad (4)$$

Where:
$\rho$ = density of the medium
c = speed of sound
$U_1$ = velocity amplitude of the cancelling sound
$U_2$ = velocity amplitude of the source sound
$S_1$ = area over which the velocity amplitude is $U_1$
$S_2$ = area over which the velocity amplitude is $U_2$ To achieve theoretically complete cancellation ($P_{oo}$=0) Equation 4 becomes:

$$U_1 S_1 + U_2 S_2 = 0 \quad (5)$$

Or, expressed differently:

$$U_1 = -U_2 \frac{S_2}{S_1} \quad (6)$$

Equations 5 and 6 reveal that the volume flow of the cancelling source must have the same magnitude as that of the noise source but 180° out of phase, which is well known. However, the effect on the first cross mode of introducing the cancelling sound symmetrically to the source sound is surprising, and was first found empirically. Based on the theoretical considerations expressed above, it can be shown that the pressure at any point (x,y, z≦0) in the duct is given by:

$$P = \sum_{m,n=0}^{\infty} \frac{\omega \rho}{k_Z} (B_{mn}) \left( \cos \frac{m\pi}{a} x \times \cos \frac{n\pi}{b} y \right) (e^{-jk_z z})(e^{j\omega t}) \quad (7)$$

For the conditions of cancellation of plane waves given in Equations (5) and (6) above, the coefficient $B_{mn}$ can similarly be shown by conventional techniques to be:

$$B_{mo} = \frac{2}{m\pi} (U_1 - U_2)[1 + (-1)^m] \sin m\pi \frac{c}{a} \quad (8)$$

Thus, for the first cross mode where m=1 and n=0, assuming a is greater than b, $B_{mo}$=0 since the term $[1+(-1)^m]$ in Equation (8) equals zero for m=1. This shows that in the configuration of the subject invention shown in FIGS. 7 and 7a, the frequency range over which relatively high acoustic attenuation may be obtained is effectively doubled by elimination of the first cross mode.

Figure 10:
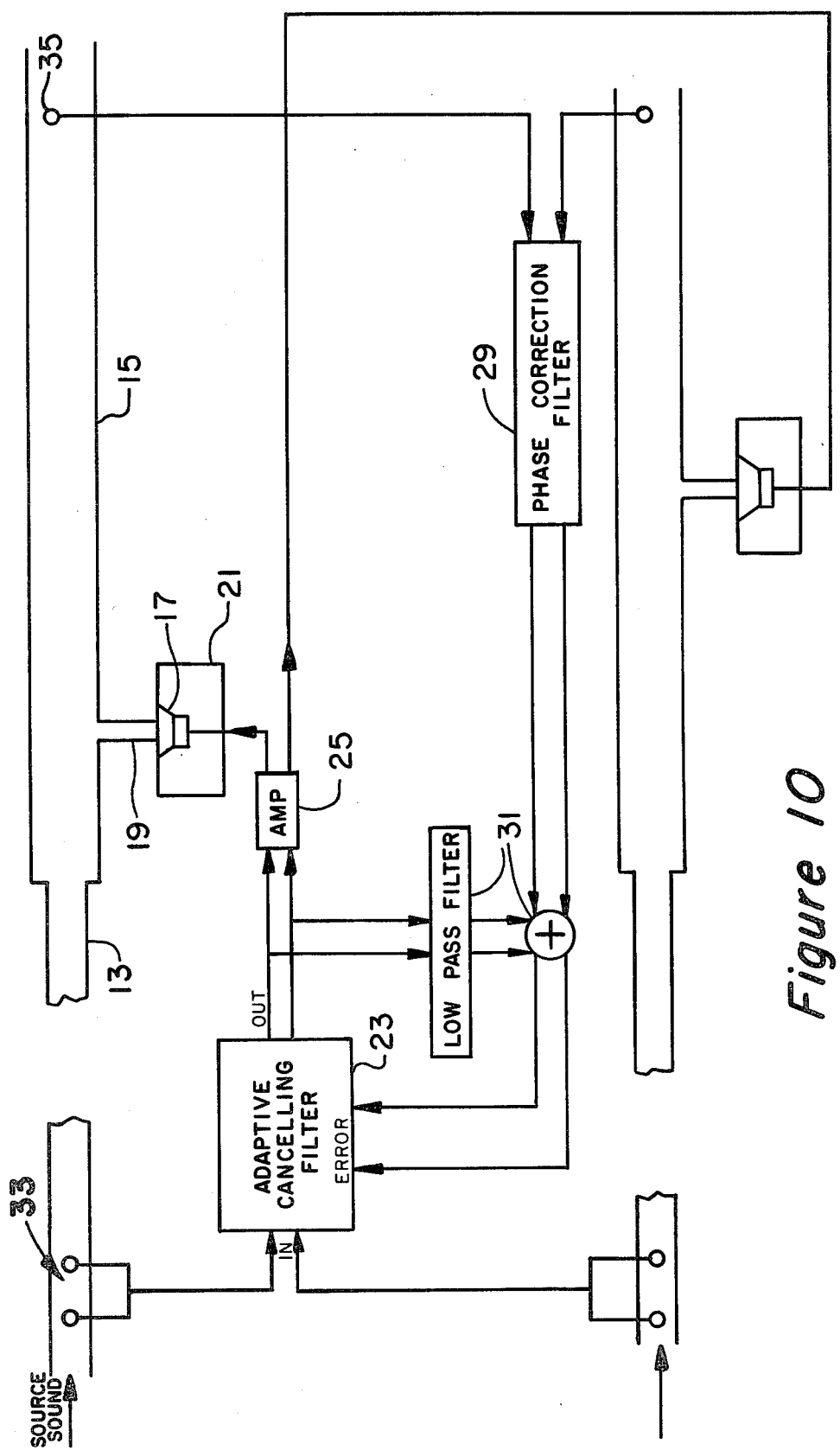
FIG. 10 shows a multistaging function of the subject invention in which a single electrical circuitry component is used with physical system and coupling components in two separate ducts.
Figure 11:
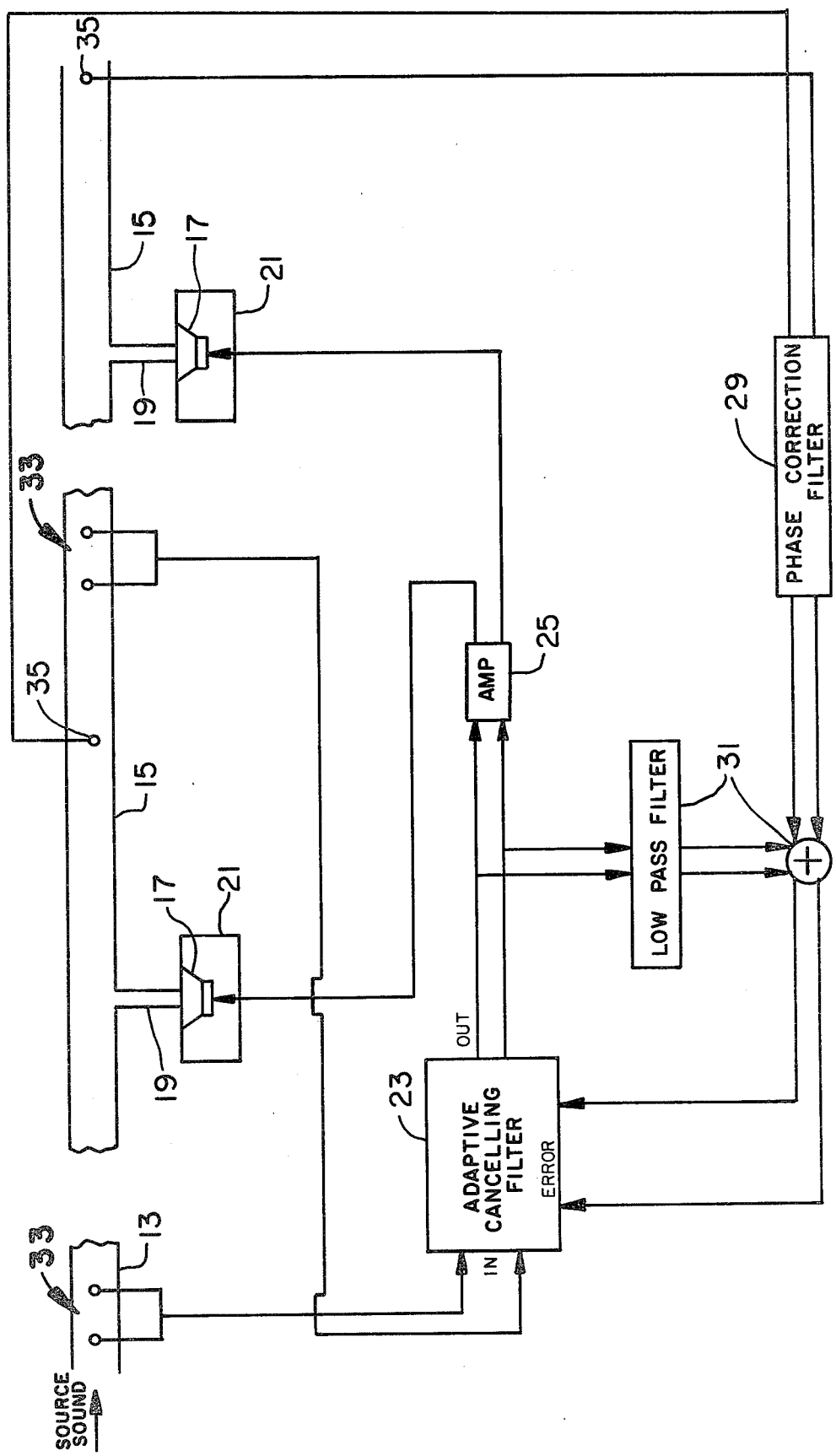
FIG. 11 shows a multistaging function of the subject invention in which two sets of microphone arrays, speakers and error microphones are disposed in series within a single duct controlled by a single electrical circuitry component.

Techniques similar to those used in time-sharing computers may be applied to the electronic circuitry component herein, with appropriate modification for microphone and loudspeaker transducer characteristics, to permit multi-stage or duplex operation of active attenuator 11 as shown in FIGS. 10 and 11. Referring to FIG. 10, a separate microphone array 33, speaker 17, waveguide 19 and microphone 35 is provided for two separate ducts 13 each having an acoustic mixer 15. A single electrical circuitry component of the subject invention, as described above, is capable of controlling the separate physical system components to achieve attenuation in both of the ducts 13. Thus, in applications where two separate duct systems are run parallel to one another with each system carrying the same or a different source sound, the active attenuator 11 herein has the capability of achieving attenuation in both systems with a single electrical circuitry component.

A second application of this multi-stage or duplex capability of the subject invention is shown in FIG. 11. In some instances it may be desireable to obtain a level of attenuation in excess of 25 to 35 db. The configuration of FIG. 11 includes two sets of microphone arrays 33, speakers 17, waveguides 19 and microphones 35 with one set being disposed downstream from the other within the same duct 13. As the source sound propagates through duct 13 it will be attenuated by the first speaker 17 as discussed above, and then the attenuated source sound will be attenuated further by the second speaker 17 in the same manner. By placing two separate physical system components of active attenuator 11 in series within a single duct 13, the attenuation obtained will be additive and result in a significant reduction in the decibel level of the sound which finally leaves the duct system. Again, a single electrical circuitry component of the subject invention using time-sharing techniques is capable of controlling both sets of physical system components.

ELECTRONIC CIRCUITRY

The second primary component of the active acoustic attenuator 11 of the subject invention is the electronic implementation or control of the physical system described above. A brief description of the prior art may be helpful in appreciating the advances made in the electronic control circuitry herein. The linear summation of two equal and opposite signals has long been recognized as one approach to producing an electronic or acoustic null. Several of the acoustic cancellers developed to date are based on the "equal and opposite" principle wherein a cancelling wave generated by a loudspeaker is introduced into a confined space such as a duct to reduce the pressure variations produced by sound waves propagating through the duct from a given source. In the simplest model, the signal generated by the source is considered to be a pure tone represented by a single rotating vector. The cancelling signal must track the source within some maximum permissible error to obtain the desired attenuation. A significant problem with this approach, which is recognized and solved by the present invention, is that the permissible amplitude and phase errors must be held within tolerances which are available only in the very best acoustic devices. For example, to obtain 20 decibels of cancellation the errors in the microphones, speaker and electronics of such systems must be less than 1 decibel in amplitude and 6° in phase. As discussed in more detail below, the subject invention overcomes this problem using a tolerance relaxation technique based on feedback principles. Rather than requiring accuracy in all components, a feedback system concentrates the performance requirements in a few easily controlled devices.

One of the most recent so-called active attenuation systems is found in U.S. Pat. No. 4,122,303 to Chaplin et al, which ostensibly uses an "adaptive" process to generate a cancelling wave capable of creating a null when combined with the sound waves from a source. An examination of this system however reveals that the electronic circuitry does not rely on a true adaptive process, but involves a trial and error approach in which a series of successive guesses or estimations are made of the error signal, which is the difference between the desired and actual attenuation. Eventually, the guesses of the error signal become closer and closer approximations of the desired error according to preset values. Not only is the trial and error method unduely lengthy (in the range of between 5 and 30 minutes), but after the process is completed the system must be manually shut down to avoid "system hunting" or oscillation between better and poorer results. In addition, once the trial and error process has begun in the Chaplin et al system, any change in the source sound in the 5 to 30 minutes required to complete the process will also result in "system hunting".

One key aspect of the electronic circuitry herein is that it is a deterministic system utilizing true adaptive filters in contrast to the trial and error approach taught in Chaplin et al. This means that the electronic circuitry of the subject invention automatically adjusts its own parameters and seeks to optimize its performance according to specific criteria. Additionally, by using the feedback principles mentioned above, the electronic circuitry herein is not nearly as dependent on the tolerance requirements of acoustic devices used in many of the known prior art systems. In fact, where the permissible amplitude and phase errors of acoustic devices used in prior art systems are on the order of 1 decibel in amplitude and 6° in phase, the electronic circuitry herein can tolerate amplitude and phase errors in the range of at least 10 decibels and 45° phase. By relaxing the tolerance requirements, the installation and maintenance of this system may be performed by technicians of ordinary skill making the active acoustic attenuator 11 commercially viable in a variety of applications.

The electronic circuitry for the active attenuator 11 utilizes a modified form of the Widrow-Hoff LMS adaptive algorithm in a true adaptive acoustic cancelling configuration. The LMS algorithm was designed for use in signal enhancement systems where the signal to noise improvement, or the noise reduction, was achieved solely in the electronic circuitry. This algorithm was significantly modified in the subject circuitry to permit operation when the vibration or noise reduction and/or cancellation is to be achieved in a physical system having inherent delays such as in an acoustic field. The modifications of the Widrow-Hoff LMS algorithm retain the signal processing advantages inherent in the original algorithm and permits these advantages to be applied to active acoustic cancelling problems. Other adaptive algorithms exist for the solution of the quadratic error function and many of these could be modified for satisfactory operation in an acoustic cancellor. The purpose of the adaptive algorithm, as discussed in detail below, is to find an optimum or near optimum solution to the cancelling filter problem. Such other algorithms, modified in accordance with the teachings herein, can accomplish this function and should be considered within the scope of the subject invention.

Figure 12:
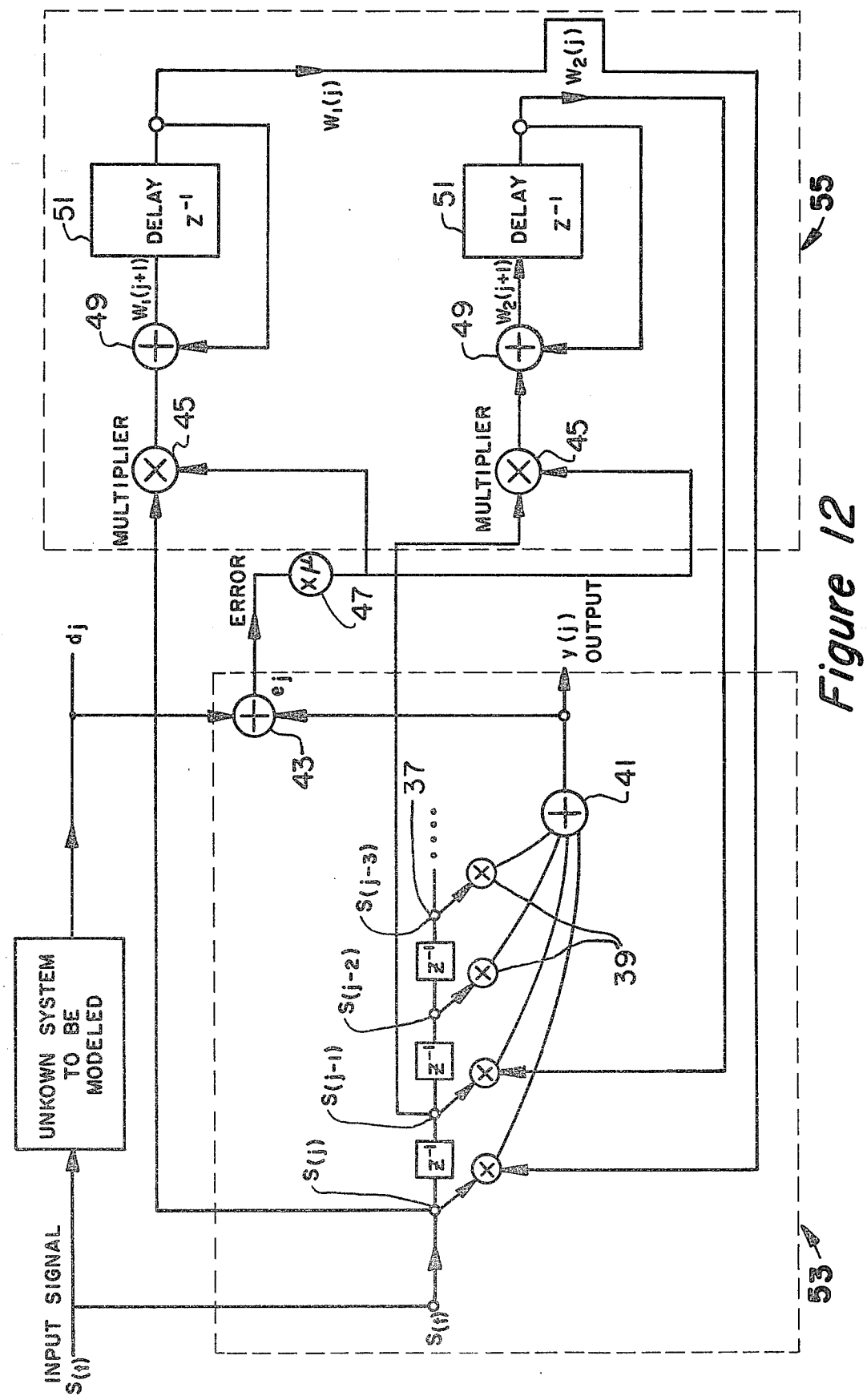
FIG. 12 is a partial block diagram of the digital realization of an adaptive filter with the standard Widrow-Hoff LMS algorithm.

Before discussing the modification of the LMS algorithm in the adaptive filters of the subject invention, a review of an adaptive filter having a standard LMS algorithm governing its operation will be discussed. Referring to FIG. 12, an adaptive filter using the standard Widrow-Hoff LMS algorithm is shown. The basic element of an adaptive filter is known as a transversal filter 53 as indicated in dotted lines in FIG. 12. The transversal filter 53 can be visualized as a series of delay elements with the filter output being derived from a weighted summation of the delayed outputs. In FIG. 12, a set of n measurements $S(t)$ is sampled to form n sample measurements S(j) where j is the sampled time index. Each of the points labeled 37 in FIG. 12 can be considered as constituting sampled input values, with the $Z^{-1}$ factor representing a delay. Each sample value 37 is multiplied by a corresponding weighting coefficient W(j) in multiplier 39, and the weighted measurements are entered into a summer 41 to form an output $y_j$ which is the output of the transversal filter 53. This output $y_j$ is compared with a desired response $d_j$ in a summer 43 to form an error signal $e_j$.

The objective of the LMS algorithm which governs the operation of the transversal filter 53, is to deterministically obtain the weighting coefficient in such a way as to minimize the error signal $e_j$ and find the weighted sum of the input signals that best matches the desired response. Changes in the weight vector to accomplish this end are made along the direction of the estimated gradient vector based on the method of steepest descent on the quadratic error surface. A detailed treatment of this subject can be found in the article by Prof. Bernard Widrow entitled "Adaptive Filters" from *Aspects of Network and System Theory* edited by Rudolph E. Kalman and Nicholas DeClaris. A block diagram representation of a digital realization of the LMS algorithm is found on the right-hand portion of FIG. 12, which is contained in the dotted lines shown and labelled generally as 55. Although shown in digital form, it should be noted that an analog realization of the LMS algorithm and transversal filter may also be used.

For purposes of illustration, only two sample input values and their corresponding weighted functions are shown in the drawings. The input S(j) is sent to a multiplier 45. The error signal $e_j$, together with a scaling factor $\mu$, which controls the rate of convergence and stability of the algorithm, is entered into a multiplier 47. The scaled error signal is then multiplied in multiplier 45 with signal S(j), and that product is introduced to a summer 49 and unit dely 51 or C RAM (Coefficient Random Access Memory). The weight setting $W_1$ (j+1) is sent back to the adjustable weight 39 corresponding to input signal S(j+1) whose product then forms part of the output of the transversal filter 53. The same operation is conducted for input signal S(j-1) corresponding to weight $W_2$(j). As mentioned above, the LMS algorithm has proved to be effective in many adaptive signal processing applications wherein the weight setting determined from the error signal can be fed directly back to the adjustable weight corresponding to the input signal for which it was determined with essentially no delay.

Figure 13:
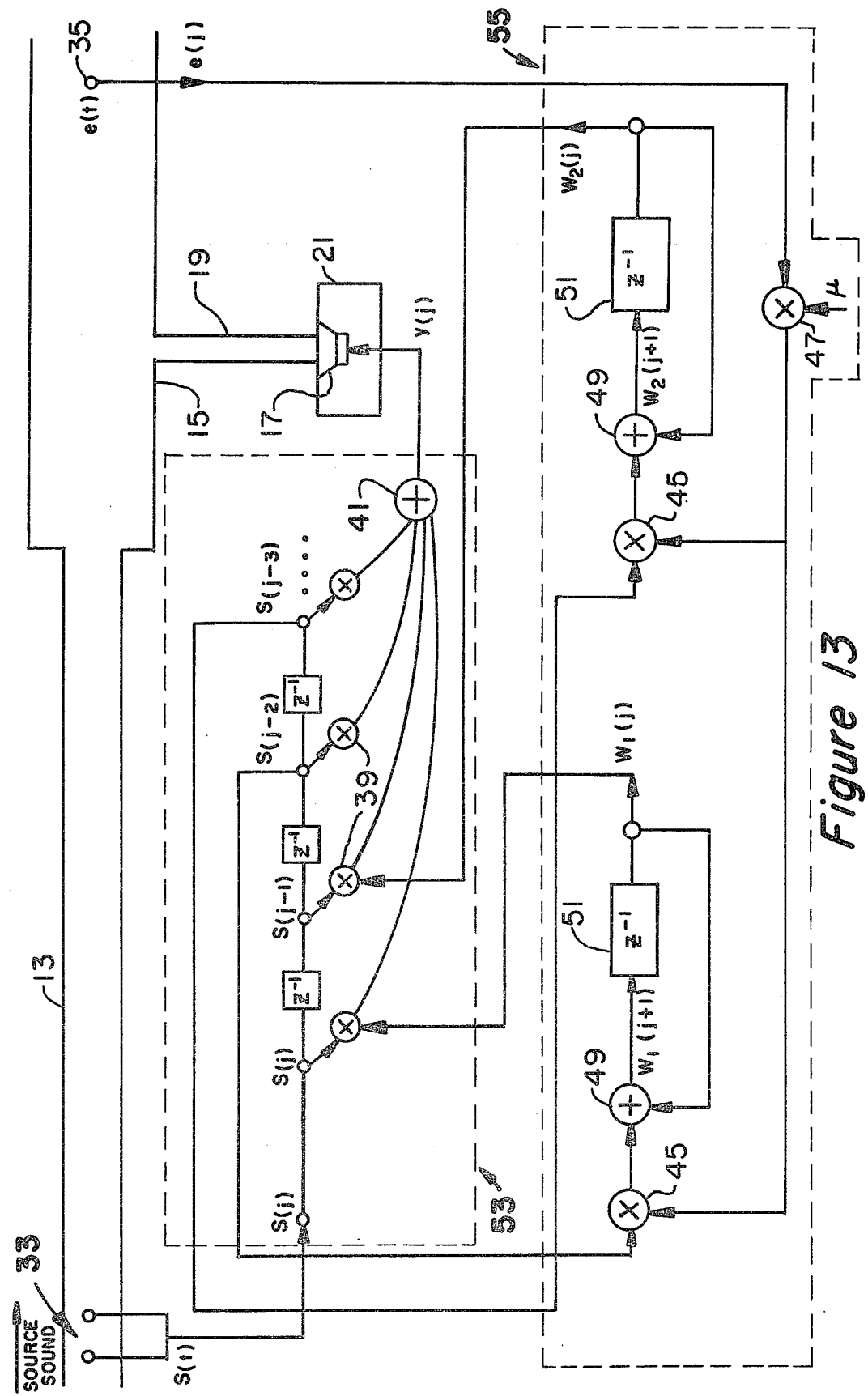
FIG. 13 is a partial block diagram of the digital realization of an adaptive filter herein with a modified Widrow-Roff LMS algorithm.
Figure 14:
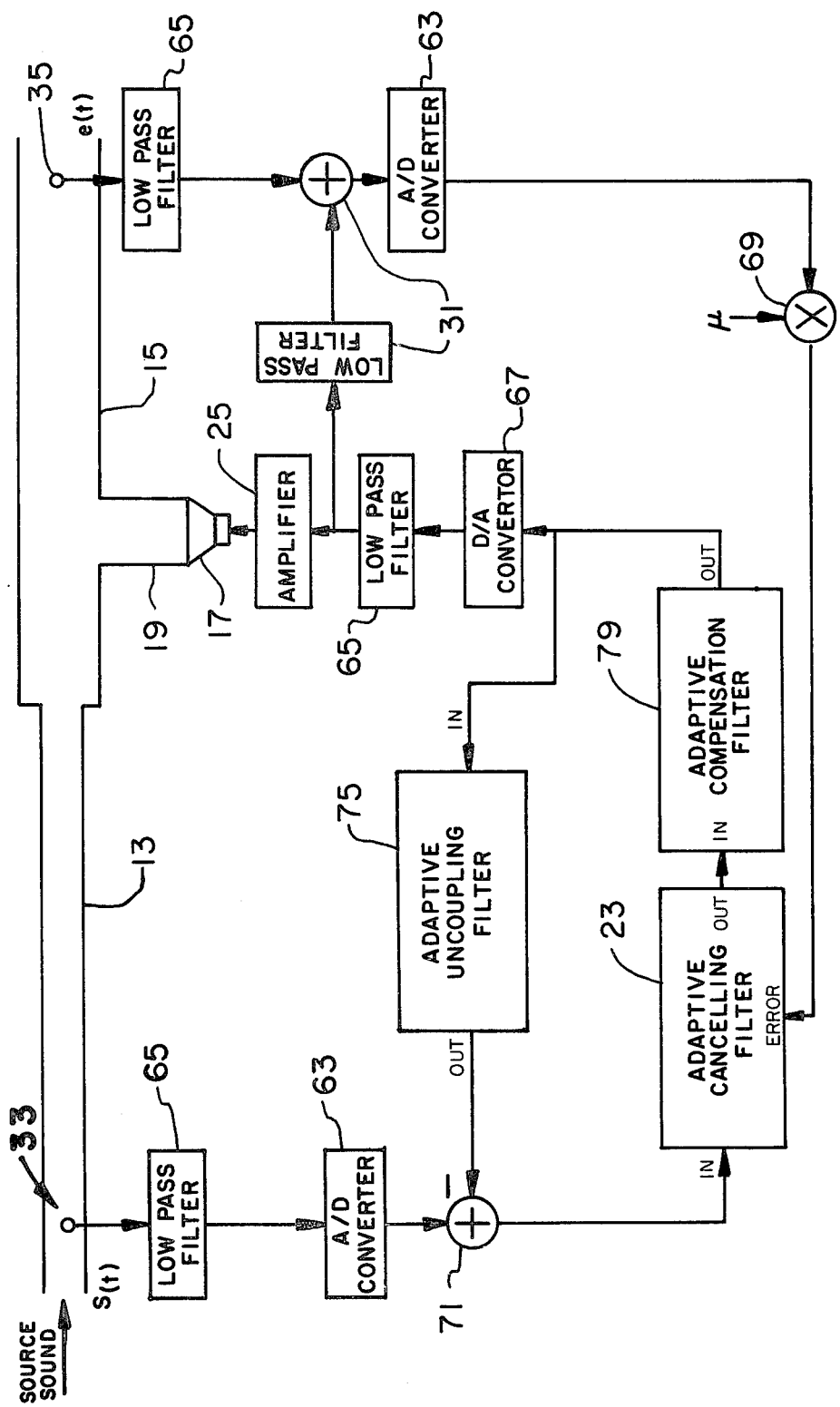
FIG. 14 is a block diagram of the electrical circuitry component of the subject invention.

In the form shown in FIG. 12, the LMS algorithm and transversal filter would not be suitable for use in an acoustic cancellation problem. The cancellation of an acoustic wave propagating down a duct requires an equal and opposite signal to interact with it to reduce the maximum pressure variations generated in the acoustic mixer 15. The interaction of the two waves requires a finite length of travel and a corresponding amount of time. Referring now to FIGS. 13 and 14, it can be observed that in the physical system of active attenuator 11 a finite length of time is required for an acoustic wave to propagate from the microphone array 33 where the input signal is detected. In addition, a delay exists in the time required for the cancelling sound produced by speaker 17 to propagate through waveguide 19 to acoustic mixer 15. These delays may be approximated as the distance in feet through duct 13, acoustic mixer 15 and waveguide 19 divided by 1100 feet per second, which is the speed of sound. The expected delay for most systems will be from a few milliseconds to a few tenths of a second. Using a sampling rate of more than 2000 per second, the delay expressed in sampling intervals will be from several to several hundred.

Expressed in terms of the sampling intervals, the delay may be given as follows:

Delay = $K(1/\text{sampling rate})$

Where: K = an integer constant

The Widrow-Hoff LMS algorithm was modified to account for the inherent delay in the physical system of active attenuator 11 such that the weighting coefficients determined in the algorithm would be matched with the corresponding signal inputs in the transversal filter for which the weighting coefficients were determined.

For a new input signal sample S(j), the corresponding weighting coefficient may be expressed as follows:

$$W_1(j) = W_1(j-1) + \mu S[j-(K+1)]e(j-1) \quad (10)$$

Where: $\mu$ = scaling factor

The next value of the weights can be written in the following form:

$$W_i(j+1) = W_i(j) + \mu S(j-K)e(j) \quad (11)$$

Where:
 i = tap identification
 s(j−k) = input sample K intervals past

As each new sample value of the input signal is sent to the transversal filter 53 it operates to generate the product of the first weighting coefficient and the last input sample which is added to the product of the second weight and the next to last input sample, and so on until the last weight times the oldest sample is accumulated. The total accumulation of these terms is the transversal filter 53 output y(j). The weighting coefficients are updated by the corresponding input sample and error signal to account for the inherent delays in the physical system. FIG. 13 shows a digital realization of the modified LMS algorithm according to the subject invention (with K=2) in which the delay discussed above is accommodated so that corresponding weighting coefficients, input samples and error signal are combined in the adaptive filter to produce the output signal y(j).

Referring now to FIGS. 5 and 14, the electronic circuitry of the active attenuator 11 including adaptive filters utilizing a modified Widrow-Hoff LMS algorithm will be discussed. In its simplest form as shown in FIG. 5, the basic operation of the electronic implementation of active attenuator 11 may be described by the following sequence:

1. Sample the source sound wave propagating down duct 13 (signal)
2. Delay, filter and scale the signal
3. Drive speaker 17 with the output of step 2, above, to inject the proper replica of the signal
4. Sense the acoustic output of acoustic mixer 15 (error)
5. Adjust (2) using the modified LMS algorithm
6. Return to (1)

The adaptive filter 23 shown in FIG. 5 is a 3-port arrangement, consisting of 2 inputs and an output. It receives an input from the microphone array 33 which is an electrical signal corresponding to the source sound in duct 13, and produces an output signal to drive speaker 17 for the production of a mirror image replica of the source sound which is introduced in acoustic mixer 15 through waveguide 19. The output of acoustic mixer 15 sensed by microphone 35 is introduced to adaptive filter 23 as an error signal, or the summation of the source sound and the replica achieved in acoustic mixer 15.

The acoustic propagation delay inherent in the physical system of active attenuator 11 must appear as a delay over the full frequency range of interest. The phase tolerance of this delay is approximately ±45 degrees at each frequency. In the block diagram schematic of the electronic circuitry shown in FIG. 5, a second-order phase-correction filter 29 is included to compensate for the acoustic resonances in the acoustic mixer 15. The characteristics of filter 29 must be determined manually, using appropriate instrumentation, based on the duct characteristics of a particular application. As discussed below, this function may be accomplished with an adaptive filter thus eliminating manual calibration of filter 29.

A DC loop is also provided in the block diagram of active attenuator 11 shown in FIG. 5, which is labelled generally with the reference 31. Microphone 35 is not capable of detecting very low frequency components of the output from acoustic mixer 15, which, in addition to a DC component, are needed for stable operation of the LMS algorithm of adaptive filter 23. The DC loop 31 is included to provide the DC component, and the LMS algorithm has been modified to accommodate such input.

Figure 15:
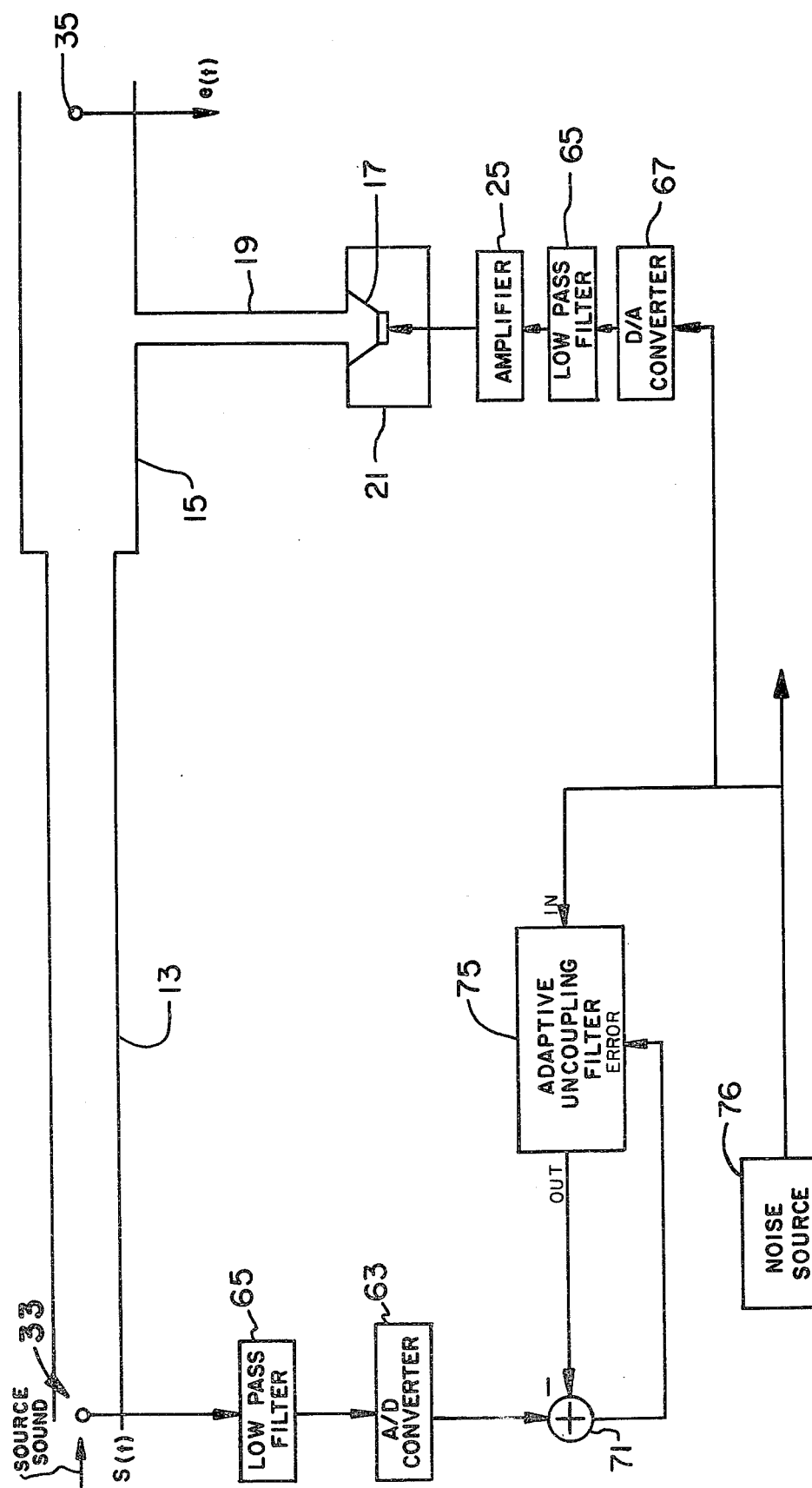
FIG. 15 is a block diagram of the adaptive uncoupling filter portion of the electrical circuitry component herein.
Figure 16:
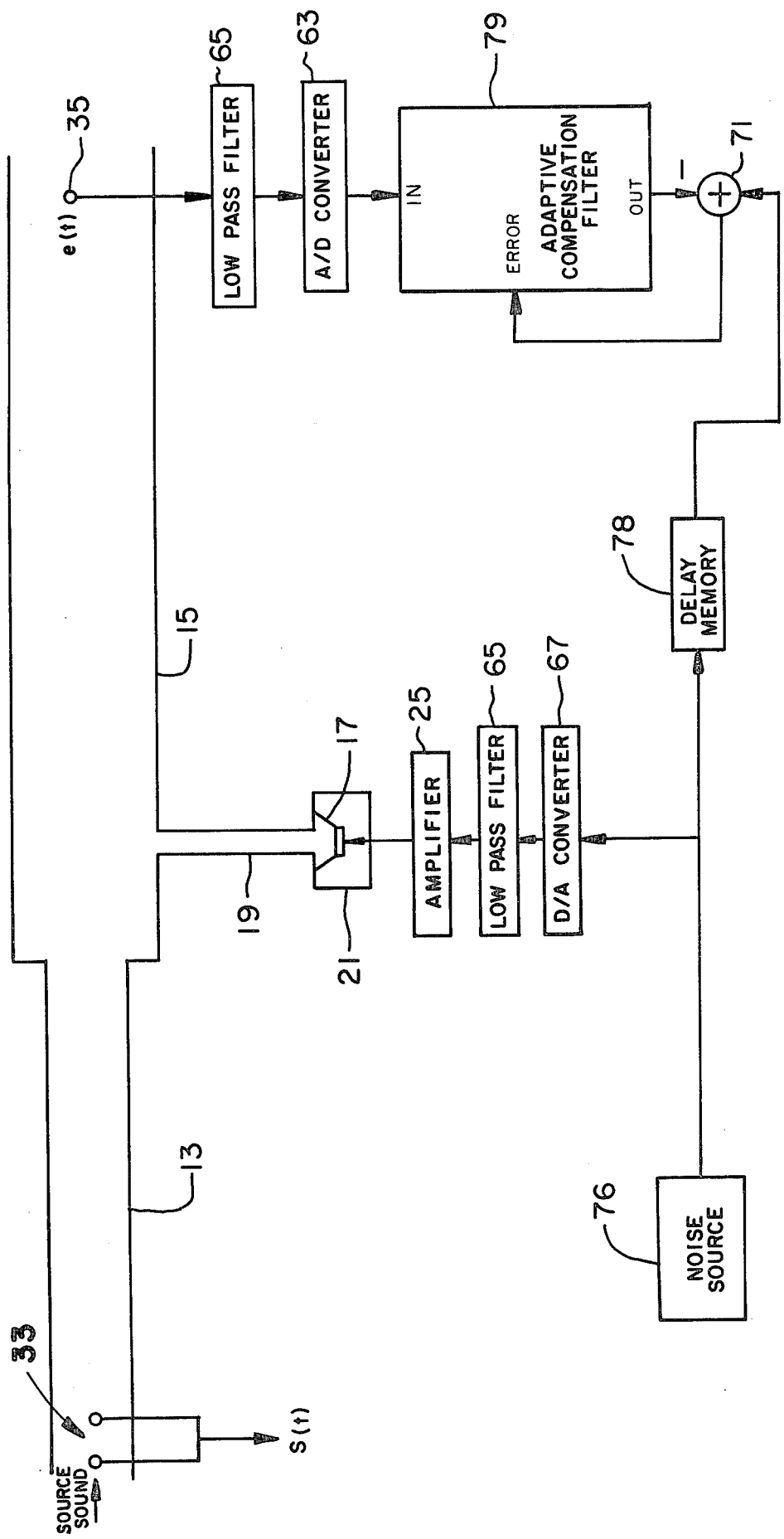
FIG. 16 is a block diagram of the adaptive compensation filter portion of the electrical circuitry component herein.

Referring now to FIGS. 14–16, an advanced form of the electronic component of active attenuator 11 is shown. Three discreet adaptive filters are included in the electronic component of active attenuator 11, each performing a separate function. Before discussing the adaptive filter processes, the function of the remaining circuit elements should be mentioned. A digital implementation of the adaptive algorithm is used in this embodiment of the electronic circuitry of active attenuator 11. The analog to digital converters (A/D), labelled generally as 63 in FIGS. 14–16, provide the sample values of the selected inputs in digital format. The A/D converters 63 are 12 bit successive approximation converters.

Most of the signal processing within the electronic circuitry herein is digital, and the sampling rate of the A/D converters 63 implies an upper limit on the allowable bandwidth of the signal and error inputs. The sampling rate limit requires that the maximum input frequency must be less than half the sampling rate. The low pass filters 65 of the system inputs are required to limit the maximum input frequency to less than one-half of the A/D sampling rate. The output signal from the digital to analog (D/A) converter 67, will also have a frequency aliasing problem. The output signal from the adaptive filters could excite a resonance in the system at any alias, or multiple, of the D/A converter 67 output. Therefore the low pass filter 65 on the output of D/A converter 67 is required to limit the maximum output frequency to the band of interest.

The multipliers 39, 45, 47 and 69, and accumulators or adders 41, 43, 49, and 71 shown in FIGS. 12–16 perform the computations necessary for the adaptive processing herein. It has been found that the TRW Model TDC1003J 12 bit Parallel Multiplier-Accumulator, or a suitable equivalent, provides the high speed calculation capabilities required.

The first of the three adaptive filters utilized in the electronic circuitry component of active attenuator 11 may be described as the adaptive cancelling filter 23 as shown in FIGS. 5 and 14. The adaptive cancelling filter 23 includes a modified LMS algorithm to govern the operation of its transversal filter as discussed above. To expand on the prior discussion, the basic filter functions of the adaptive cancelling filter 23, including phase response, amplitude and delay, are implemented by the transversal filter which is a non-recursive, finite impulse response filter. The filter implementation is digital in nature with both the input signal history and the tap weights being stored in a Random Access Memory (RAM). As mentioned above, the operation of the transversal filter can be described as generating the product of the first weight obtained from the LMS algorithm and the last input sample, plus the second weight from the algorithm times the next to last input sample, and so on until the last weight times the oldest sample is accumulated. In equation form, this may be given as follows:

$$\text{Output} = \sum_{i=1}^{i=I} S_i W_i \qquad (12)$$

Where:
$S_i$ = sampled input signal corresponding to the ith tap
$W_i$ = weight of the ith tap
i = tap identification
I = number of taps The adaptive cancelling filter 23 may be considered to be a transversal filter when the weight adjustments are stopped. The operation of adaptive cancelling filter 23 will determine the required values for the weights of the desired filter (i.e., optimum filter conditions) by adaptive means and then realize the desired filter function by using the determined weights in the transversal filter. The purpose of the modified LMS algorithm is to govern the transversal filter operation by matching the filter function of adaptive cancelling filter 23 to the desired filter function.

The error signal sensed by microphone 35 and sent to adaptive cancelling filter 23, can be visualized as the summation of the source pressure wave sensed by microphone array 33 delayed by the acoustic travel from that point to microphone 35, plus the cancelling wave produced by speaker 17 delayed by the travel through waveguide 19 and acoustic mixer 15 to microphone 35. In physically positioning microphone array 33, speaker 17, waveguide 19 and microphone 35 relative to one another in the duct 13 and acoustic mixer 15, the total delay or length from microphone array 33 to microphone 35 must be greater than the total delay or length from speaker 17 to microphone 35 plus the delay associated with the operation of low pass filters 65. In equation form, this relationship may be expressed as follows (See FIG. 5):

$$T > \lambda min/4 + d_1 + d_2 + D_f \qquad (13)$$

Where:
$\lambda min$ = shortest wavelength of interest
T = distance between microphone array 33 and microphone 35
$d_1$ = distance from waveguide 19 to microphone 35
$d_2$ = distance from acoustic mixer 15 (i.e., in alignment with microphone 35) to speaker 17

$D_f$=delay associated with low pass filters 65

The delay $D_f$ of the low pass filters 65 can be expressed in terms of cutoff frequency or $F_{max}$. A fourth order low pass filter 65 will have a delay of 45 degrees for each pole at the cutoff frequency, and a good filter design will approximate a constant delay filter. Therefore, the delay for a fourth order filter can be approximated as $\frac{1}{2}F_{cutoff}$, and $D_f$ may be considered to be approximately equal to $1/F_{cutoff}$ for the two sets of fourth order filters in series.

The second adaptive filter found in the electric circuitry component of active attenuator 11 may be termed an uncoupling adaptive filter 75, as shown in FIGS. 14 and 15. One potential problem associated with most active attenuators is the production of standing waves or mechanical vibrations of the duct as a result of the cancelling sound introduced by the speaker propagating toward the microphone or microphone array which senses the source sound. This coupling will tend to corrupt the signal sensing microphone's estimate of the source sound propagating downstream and reduce the effectiveness of the cancelling system. Although unidirectional microphones have been suggested as a means to avoid this problem, they are not sufficient acting alone to overcome this inherent system limitation.

The uncoupling adaptive filter 75 herein solves this problem as follows. As shown in FIG. 15, a broad band noise source 76 drives the cancelling loudspeaker 17 and the uncoupling adaptive filter 75. Prior to start up the system, the noise source 76 is automatically adjusted to drive the duct 13 at a sound level higher than the source level required to cancel the expected source noise. The adaptive process will reduce the output of the error summer and match the transfer function of the transversal filter in the adaptive uncoupling filter 75 to the acoustic coupling present in duct 13, at which time the noise source 76 will be terminated. At start up of the system, the adaptive uncoupling filter 75 will operate on the drive to the loudspeaker 17. The components of the loudspeaker drive that appear in the output from microphone array 33 will be removed by subtracting an equal and opposite image at summer 71. The subtraction process is accomplished electronically in the digital domain of the adaptive uncoupling filter 75 and in summer 71. Although this procedure will not entirely eliminate the effect of the output from speaker 17 on microphone array 33, sufficient reduction will be obtainable in most applications.

Referring now to FIGS. 14 and 16, the third adaptive filter of the electronic circuitry component in active attenuator 11 is shown, which may be called an adaptive compensation filter 79. As mentioned above in connection with the discussion of the basic electronic component shown in FIG. 5, compensation means must be provided in series between the output of adaptive cancelling filter 23 and the input of the error signal thereto to assure stable operation of the modified LMS algorithm. While this compensation was shown as a second-order phase-correction filter 29 in FIG. 5, it was noted that the manual calibration of filter 29 could be accomplished by an adaptive filter. The adaptive compensation filter 79 performs this function.

As shown in FIG. 16, the adaptive compensation filter 79, loudspeaker 17, waveguide 19, acoustic mixer 15 and microphone 35 are in series with each other, and in parallel with the broad band delay circuit consisting of a delay or memory 78. Prior to start up of the system and following the completion of the uncoupling process described above, the noise source 76 will be activated to drive duct 13 and acoustic mixer 15. The summation of the parallel signal paths will be the error input into the adaptive compensation filter 79. The adaptive process will match the total transfer function of the series path to the true delay of the noise source 76 by delay 78. In this way the weights for the desired filter are generated, and the error signal received by adaptive cancelling filter 23 will be within the proper phase tolerance to assure stable operation.

Delay circuit 78 of FIG. 16 will delay the signal from noise source 76 by an integer number of input sample intervals (K). The modification of the LMS algorithm in adaptive filter 23 in FIG. 14, will provide for a delay of K sample intervals in the calculation of the next value for $W_i$. The value of K will be greater than the acoustic delay from loudspeaker 17 to the signal input of the adaptive compensation filter 79 of FIG. 16. The value of K can be set large so that one value can be used in most applications. The matching of the delay from the output to the error input of the adaptive cancelling filter 23 in FIG. 14, to the shift in the sampled signal used in the calculation of the next weight value, will assure the stability of the modified LMS algorithm.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound, said cancelling sound being introduced into said duct for combination with and attenuation of said source sound;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and electronic controller means coupled to said input sensing means, cancelling means and error sensing means for activating and controlling said cancelling means to produce said cancelling sound, said electronic controller means including an adaptive cancelling filter employing a modified deterministic algorithm operable to accommodate said acoustic propagation delays.

2. The apparatus of claim 1 wherein said input sensing means includes at least one microphone.

3. The apparatus of claim 1 wherein said cancelling means is disposed in a protective enclosure lined with acoustically absorbent material.

4. The apparatus of claim 1 wherein said cancelling means is disposed in a protective enclosure lined with acoustically absorbant material.

5. The apparatus as in claim 1 wherein said acoustic propagation delays include the time of propagation of said cancelling sound from said cancelling means to said duct.

6. The apparatus as in claim 1 wherein said deterministic algorithm is a modified least-mean-square algorithm.

7. Apparatus as in claim 1 further including waveguide means for connecting said cancelling means to said duct, said cancelling sound being introduced into said duct through said waveguide for combination with and attenuation of said source sound 8. Apparatus as in claim 1 further including an acoustic mixer connected to said duct at a location spaced from said input sensing means in the direction of propagation of said source sound and forming a continuation of said duct.

9. Apparatus as in claim 1 for the attenuation of sound from a source propagating in a duct having a terminal end and a cross-sectional area with a maximum transverse dimension, further including waveguide means for connecting said cancelling means to said duct, said waveguide means being spaced a distance at least three times said maximum transverse dimension of said duct from said terminal end of said duct, said cancelling sound being introduced into said duct through said waveguide for combination with and attenuation of said source sound.

10. Apparatus as in claim 1 for the attenuation of sound from a source propagating in a duct having a terminal end and a cross-sectional area with a maximum transverse dimension, further including:
an acoustic mixer connected to said duct at a location spaced from said input sensing means in the direction of propagation of said source sound and forming a continuation of said duct; and
waveguide means for connecting said cancelling means to said acoustic mixer, said waveguide means being spaced a distance at least three times said maximum transverse dimension from said terminal end of said duct, said cancelling sound being introduced into said duct through said waveguide means for combination with and attenuation of said source sound.

11. Apparatus for the attenuation of sound from a source propagating in a duct comprising:
input sensing means for detecting said source sound, said input sensing means producing first electrical signals representing the amplitude and phase characteristics of said source sound;
cancelling means for generating cancelling sound, said cancelling sound being introduced into said duct for combination with and attenuation of said source sound;
error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and
electronic controller means coupled to said input sensing means, cancelling means and error sensing means for activating and controlling said cancelling means to produce said cancelling sound, said electronic controller means including an adaptive cancelling filter comprising a transversal filter having a number of filter weights, said adaptive cancelling filter employing an algorithm for adapting said weights in a manner to accommodate said acoustic propagation delays.

12. Apparatus for the attenuation of sound from a source propagating in a duct comprising:
input sensing means for detecting said source sound, said input sensing means producing first electrical signals representing the amplitude and phase characteristics of said source sound;
cancelling means for generating cancelling sound,
a pair of waveguide means for connecting said cancelling means with said duct, said waveguide means being connected parallel to and on opposite sides of said duct at a location spaced from said input sensing means in the direction of propagation of said source sound, said waveguide means introducing said cancelling sound into said duct in the direction of propagation of said source sound for combination with said source sound thereby preventing the first cross mode of said source sound from developing in said duct;
error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and
electronic controller means coupled to said input sensing means, cancelling means and error sensing means for activating and controlling said cancelling means to produce said cancelling sound, said electronic controller means including an adaptive cancelling filter employing a modified deterministic algorithm operable to accommodate said acoustic propagation delays.

13. Apparatus for the attenuation of sound from a source propagating in a duct comprising:
input sensing means for detecting said source sound, said input sensing means producing first electrical signals representing the amplitude and phase characteristics of said source sound;

cancelling means for generating cancelling sound;
a pair of waveguide means for connecting said cancelling means to said duct, said waveguide means being connected perpendicular to said duct and in alignment with one another on opposite sides of said duct to provide paths for propagation of said cancelling sound to said duct for combination with said source sound, thereby preventing the first cross mode of said source sound from developing in said duct;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and electronic controller means coupled to said input sensing means, cancelling means and error sensing means for activating and controlling said cancelling means to produce said cancelling sound, said electronic controller means including an adaptive cancelling filter employing a modified deterministic algorithm operable to accommodate said acoustic propagation delays.

14. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound, said cancelling sound being introduced into said duct for combination with and attenuation of said source sound;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller, coupled to said input sensing means, cancelling means and error sensing means, including an adaptive cancelling filter, an amplifier, a phase correction filter and DC loop means, said adaptive cancelling filter employing a modified deterministic algorithm operable to accommodate acoustic propagation delays for the production of an output, said amplifier receiving said output and driving said cancelling means for the production of said cancelling sound, said phase correction filter adjusting the phase characteristics of said second electrical signal produced by said error sensing means and said DC loop means providing a DC signal for introduction into said adaptive cancelling filter to assure stable operation thereof.

15. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound, said cancelling sound being introduced into said duct for combination with and attenuation of said source sound;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller, coupled to said input sensing means, cancelling means and error sensing means, including an adaptive cancelling filter, an amplifier, a phase correction filter and DC loop means, said adaptive cancelling filter comprising a transversal filter having a number of filter weights, said adaptive cancelling filter employing an algorithm for adapting said weights in a manner to accommodate said acoustic propagation delays for the production of an output, said amplifier receiving said output and driving said cancelling means for the production of said cancelling sound, said phase correction filter adjusting the phase characteristics of said second electrical signals produced by said error sensing means and said DC loop means providing a DC signal for introduction into said adaptive cancelling filter to assure stable operation thereof.

16. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound, said cancelling sound being introduced into said duct for combination with and attenuation of said source sound, said cancelling sound producing at least some standing waves propagating in the opposite direction of said source sound, said standing waves being detectable by said input sensing means and being incorporated into said first electrical signals representing the amplitude and phase characteristics of said source sound within said duct;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller including an adaptive uncoupling filter, an adaptive compensation filter and an adaptive cancelling filter, said adaptive uncoupling filter being operable to substantially remove the component of said first electrical signals produced by said input sensing means representing said standing waves generated by said cancelling sound and sensed by said input sensing means, said adaptive compensation filter being operable to adjust the phase characteristics of said second electrical signals produced by said error sensing means for introduction into said adaptive cancelling filter to assure stable operation thereof, said adaptive cancelling filter employing a modified deterministic algorithm operable to accommodate said acoustic propagation delays for the production of an output for activating and controlling said cancelling means to produce said cancelling sound.

17. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound, said cancelling sound being introduced into said duct for combination with and attenuation of said source sound, said cancelling sound producing at least some standing waves propagating in the opposite direction of said source sound, said standing waves being detectable by said input sensing means and being incorporated into said first electrical signals representing the amplitude and phase characteristics of said source sound within said duct;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller including an adaptive uncoupling filter, an adaptive compensation filter and an adaptive cancelling filter, said adaptive uncoupling filter being operable to substantially remove the component of said first electrical signals produced by said input sensing means representing said standing waves generated by said cancelling sound and sensed by said input sensing means, said adaptive compensation filter being operable to adjust the phase characteristics of said second electrical signals produced by said error sensing means for introduction into said adaptive cancelling filter to assure stable operation thereof, said adaptive cancelling filter comprising a transversal filter having a number of filter weights, said adaptive cancelling filter employing an algorithm for adapting said weights of said transversal filter to accommodate said acoustic propagation delays for the production of an output to activate and control said cancelling means for generating said cancelling sound.

18. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound;

a pair of waveguide means for connecting said cancelling means with said duct, said waveguide means being connected parallel to and on opposite sides of said duct at a location spaced from said input sensing means in the direction of propagation of said source sound, said waveguide means introducing said cancelling sound into said duct in the direction of propagation of said source sound for combination with said source sound thereby preventing the first cross mode of said source sound from developing in said duct, said cancelling sound producing at least some standing waves propagating in the opposite direction of said source sound, said standing waves being detectable by said input sensing means and being incorporated into said first electrical signals representing the amplitude and phase characteristics of said source sound within said duct;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller including an adaptive uncoupling filter, an adaptive compensation filter and an adaptive cancelling filter, said adaptive uncoupling filter being operable to substantially remove the component of said first electrical signals produced by said input sensing means representing said standing waves generated by said cancelling sound and sensed by said input sensing means, said adaptive compensation filter being operable to adjust the phase characteristics of said second electrical signals produced by said error sensing means for introduction into said adaptive cancelling filter to assure stable operation thereof, said adaptive cancelling filter employing a modified deterministic algorithm operable to accommodate said acoustic propagation delays for the production of an output for activating and controlling said cancelling means to produce said cancelling sound.

19. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound;

a pair of waveguide means for connecting said cancelling means with said duct, said waveguide means being connected perpendicular to said duct in alignment with one another on opposite sides of said duct to provide paths for propagation of said cancelling sound to said duct for combination with said source sound to prevent the first cross mode of said source sound from developing in said duct, said cancelling sound producing at least some standing waves propagating in the opposite direction of said source sound, said standing waves being detectable by said input sensing means and being incorporated into said first electrical signals representing the amplitude and phase characteristics of said source sound within said duct;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller including an adaptive uncoupling filter, an adaptive compensation filter and an adaptive cancelling filter, said adaptive uncoupling filter being operable to substantially remove the component of said first electrical signals produced by said input sensing means representing said standing waves generated by said cancelling sound and sensed by said input sensing means, said adaptive compensation filter being operable to adjust the phase characteristics of said second electrical signals produced by said error sensing means for introduction into said adaptive cancelling filter to assure stable operation thereof, said adaptive cancelling filter employing a modified deterministic algorithm operable to accommodate said acoustic propagation delays for the production of an output for activating and controlling said cancelling means to produce said cancelling sound.

20. Apparatus for the attenuation of sound from a source propagating in a duct comprising:

input sensing means for detecting said source sound, said input sensing means producing first electrical signals representing the amplitude and phase characteristics of said source sound;

cancelling means for generating cancelling sound, said cancelling sound being introduced into said duct for combination with and attenuation of said source sound, said cancelling sound producing at least some standing waves propagating in the opposite direction of said source sound, said standing waves being detectable by said input sensing means and being incorporated into said first electrical signals representing the amplitude and phase characteristics of said sound within said duct;

error sensing means for detecting said combination of said cancelling sound and source sound, said error sensing means producing second electrical signals representing the amplitude and phase characteristics of said combination of said cancelling sound and source sound, the production of said second electrical signals by said error sensing means being delayed in time relative to the production of said first electrical signals by said input sensing means due to the time of propagation of said source sound from said input sensing means to said cancelling means and the time of propagation of said source sound and cancelling sound to said error sensing means; and an electronic controller including an adaptive uncoupling filter, an adaptive compensation filter, an adaptive cancelling filter, DC loop means for introducing a DC signal to said adaptive cancelling filter, and low pass filter means for limiting the frequency range of said first and second electrical signals within said electronic controller, said adaptive uncoupling filter being operable to substantially remove the component of said first electrical signals produced by said input sensing means representing said standing waves generated by said cancelling sound and sensed by said input sensing means, said adaptive compensation filter being operable to adjust the phase characteristics of said second electrical signals produced by said error sensing means for introduction into said adaptive cancelling filter to assure stable operation thereof, said adaptive cancelling filter employing a modified deterministic algorithm operable to accommodate said acoustic propagation delays for the production of an output for activating and controlling said cancelling means to produce said cancelling sound.

21. An apparatus as in claim 20 wherein said low pass filter means provide an inherent processing delay in the function of said electronic controller in addition to said acoustic propagation delays, whereby to accommodate said delays the physical spacing between said input sensing means, cancelling means and error sensing means must be in accordance with the following relationship:

$$T > \lambda min/4 + d_1 + d_2 + D_F$$

wherein $T$ = spacing between microphone array and error microphone $\lambda min$ = shortest wavelength of interest in the source sound $d_1$ = spacing between the speaker and acoustic mixer $d_2$ = spacing between the waveguide and error microphone $D_f$ = delay associated with the low pass filters.

* * * * *